(12) United States Patent
Li et al.

(10) Patent No.: US 12,733,548 B2
(45) Date of Patent: Sep. 8, 2026

(54) ELECTRONIC PACKAGE AND FABRICATING METHOD THEREOF

(71) Applicant: SILICONWARE PRECISION INDUSTRIES CO., LTD., Taichung City (TW)

(72) Inventors: Huan-Shiang Li, Taichung City (TW); Yih-Jenn Jiang, Taichung City (TW); Cheng-Kai Chang, Taichung City (TW); Wei-Son Tsai, Taichung City (TW); Yi-Chieh Wang, Taichung City (TW)

(73) Assignee: SILICONWARE PRECISION INDUSTRIES CO., LTD., Taichung City (TW)

( * ) Notice: Subject to any disclaimer, the term of this patent is extended or adjusted under 35 U.S.C. 154(b) by 542 days.

(21) Appl. No.: 18/310,644

(22) Filed: May 2, 2023

(65) Prior Publication Data

US 2024/0266335 A1 Aug. 8, 2024

(30) Foreign Application Priority Data

Feb. 3, 2023 (TW) ................................ 112103914

(51) Int. Cl.
*H10W 90/00* (2026.01)
*H10W 74/10* (2026.01)
(Continued)

(52) U.S. Cl.
CPC .......... *H10W 90/00* (2026.01); *H10W 74/117* (2026.01); *H10W 70/60* (2026.01);
(Continued)

(58) Field of Classification Search
CPC ... H01L 25/105; H01L 23/3128; H01L 24/20; H01L 24/45; H10W 90/00;
(Continued)

(56) References Cited

U.S. PATENT DOCUMENTS 6,326,235 B1 * 12/2001 Glenn ................. H10W 90/701 257/E23.068
6,429,515 B1 * 8/2002 Glenn ................... H10W 70/65 257/784

(Continued)

FOREIGN PATENT DOCUMENTS

CN 202394956 U * 8/2012
CN 103384913 A * 11/2013 .......... H10W 90/701

(Continued)

*Primary Examiner* — Laura M Menz
(74) *Attorney, Agent, or Firm* — Dority & Manning, PA

(57) ABSTRACT

An electronic package and the manufacturing method thereof are provided, in which a first electronic element and a second electronic element are disposed on a carrier structure, and the first electronic element and the second electronic element are electrically connected to each other by a wire. Therefore, by replacing some layers of the circuit layer of the carrier structure with the wire, the carrier structure can satisfy the functional signal transmission of the first and second electronic elements without configuring too many circuit layers, so as to shorten the process steps and time of the carrier structure, thereby effectively reducing the manufacturing cost of the electronic package.

16 Claims, 7 Drawing Sheets

(51) Int. Cl.
*H10W 70/60* (2026.01)
*H10W 72/00* (2026.01)
*H10W 72/50* (2026.01)

(52) U.S. Cl.
CPC .. *H10W 72/07554* (2026.01); *H10W 72/5522* (2026.01); *H10W 72/884* (2026.01); *H10W 90/734* (2026.01); *H10W 90/754* (2026.01)

(58) Field of Classification Search
CPC ............... H10W 74/117; H10W 70/60; H10W 72/07554; H10W 72/5522
See application file for complete search history.

(56) References Cited

U.S. PATENT DOCUMENTS 7,105,930 B2 * 9/2006 Lua ..................... H10W 74/012 257/E21.511
7,358,178 B2 * 4/2008 Lua ..................... H10W 74/012 257/E23.021
7,518,226 B2 * 4/2009 Cablao .................. H10W 90/00 257/686
8,097,947 B2 * 1/2012 Lua ..................... H10W 74/012 257/734
8,664,757 B2 * 3/2014 Cho ..................... H10W 90/00 257/686
8,685,792 B2 * 4/2014 Chow .................. H10W 90/00 438/109
9,754,928 B2 * 9/2017 Chen ..................... H10W 90/00
9,793,245 B2 * 10/2017 Chen ....................... H10P 72/74
10,978,432 B2 * 4/2021 Kim .................... H10P 72/7402
11,533,024 B2 * 12/2022 Lim ......................... H03F 3/19
11,764,188 B2 * 9/2023 Chia ..................... H10W 90/00 257/774
12,255,182 B2 * 3/2025 Chia ..................... H10W 90/00
12,494,460 B2 * 12/2025 Ke ........................ H10W 70/09
2004/0033673 A1 * 2/2004 Cobbley ............. H10W 74/019 438/455
2005/0017372 A1 * 1/2005 Lua ..................... H10W 74/012 257/E21.511
2005/0164486 A1 * 7/2005 Lua ..................... H10W 74/012 257/E23.021
2006/0022315 A1 * 2/2006 Huang ................ H10W 90/811 257/676
2007/0296090 A1 * 12/2007 Hembree ........... G01R 1/07314 257/784
2008/0157360 A1 * 7/2008 Lua ..................... H10W 74/012 257/E21.511
2008/0185719 A1 * 8/2008 Cablao .................. H10W 90/00 438/109
2008/0211084 A1 * 9/2008 Chow .................. H10W 90/00 257/700
2009/0166835 A1 * 7/2009 Yang ................... H10W 74/016 438/109
2011/0180913 A1 * 7/2011 Liou ...................... H10D 84/01 257/E21.511
2011/0233753 A1 * 9/2011 Camacho ............. H10W 74/111 257/784
2012/0155042 A1 * 6/2012 Haba ........................ H05K 1/11 361/782
2013/0147062 A1 * 6/2013 Lee ....................... H10W 70/60 438/109
2015/0043181 A1 * 2/2015 Haba ........................ H05K 1/11 361/752
2016/0021754 A1 * 1/2016 Chen ..................... H10W 90/00 29/841
2016/0212852 A1 * 7/2016 Hu ...................... H10W 70/614
2017/0141080 A1 * 5/2017 Chen ....................... H10P 72/74
2019/0244947 A1 * 8/2019 Yu ........................... H10P 72/74
2019/0378826 A1 * 12/2019 Kim .................... H10P 72/7402
2020/0203277 A1 * 6/2020 Ding ................... H10W 70/611
2020/0328187 A1 * 10/2020 Cho .................... H10W 74/117
2021/0408976 A1 * 12/2021 Lim ......................... H03F 3/19
2023/0015721 A1 * 1/2023 Chia ..................... H10W 90/00
2023/0395571 A1 * 12/2023 Chia ..................... H10W 90/00
2024/0170355 A1 * 5/2024 Chiu .................. H10W 74/129
2024/0266335 A1 * 8/2024 Li ....................... H10W 74/117
2024/0321769 A1 * 9/2024 Chiu ..................... H10W 42/20
2025/0087635 A1 * 3/2025 Chi ..................... H10W 74/117
2025/0201644 A1 * 6/2025 Lai ...................... H10W 74/114
2025/0266399 A1 * 8/2025 Han ................... H10W 74/131
2025/0300047 A1 * 9/2025 Chuang ............... H10W 74/129
2025/0309539 A1 * 10/2025 Lin ...................... H01Q 9/0407
2025/0372495 A1 * 12/2025 Li ....................... H10W 70/093

FOREIGN PATENT DOCUMENTS

CN 109309068 A * 2/2019 ............ H10W 90/00
CN 109509728 A * 3/2019 ............ H10W 72/00
CN 110581121 A * 12/2019 ............ H10W 90/00
CN 112397483 A * 2/2021 ............ H10W 95/00
CN 220796723 U * 4/2024
CN 118448379 A * 8/2024 .......... H10W 74/117
CN 118693050 A * 9/2024 .......... H10W 74/117
CN 112701101 B * 12/2024 ............ H10W 90/00
CN 119626991 A * 3/2025 ............ H10W 90/00
CN 120280423 A * 7/2025 ............ H10W 90/00
CN 223052138 U * 7/2025 ............ H10W 70/65
CN 223471594 U * 10/2025
JP 2013546199 A * 12/2013 .......... H10W 90/701
JP 2023531915 A * 7/2023 ............ H10W 90/00
JP 7702437 B2 * 7/2025 ............ H10W 90/00
KR 20050081884 A * 8/2005 ............ H10W 72/00
KR 101227078 B1 * 1/2013 ............ H10W 70/60
KR 20160010357 A * 1/2016 ............ H10W 70/60
KR 20160095731 A * 8/2016 .......... H10W 90/701
KR 101763019 B1 * 7/2017 ............ H10W 70/60
KR 20200121126 A * 10/2020 .......... H10W 90/701
KR 20230028394 A * 2/2023 ............ H10W 90/00
KR 102698698 B1 * 8/2024 .......... H10W 74/117
KR 102717843 B1 * 10/2024 .......... H10W 90/401
RU 2663688 C1 * 8/2018 .......... H10W 74/117
TW I760227 B * 4/2022 ............ H10W 90/00
TW I776747 B * 9/2022 .......... H10W 90/701
TW 202433714 A * 8/2024 .......... H10W 74/117
TW I866051 B * 12/2024 .......... H10W 74/117
WO WO-2012082227 A2 * 6/2012 .......... H10W 90/701
WO WO-2021262920 A2 * 12/2021 ............ H10W 90/00

* cited by examiner

ELECTRONIC PACKAGE AND FABRICATING METHOD THEREOF

BACKGROUND

1. Technical Field

The present disclosure relates to a semiconductor packaging process, and more particularly, to an electronic package and a fabricating method thereof.

2. Description of Related Art

With the vigorous development of the electronic industry, electronic products tend to be light, thin and small in form, while in terms of function, they tend to be developed toward high performance, high function and high speed. Therefore, in order to meet the high integration and miniaturization requirements of semiconductor devices, package substrates with high-density and fine-pitch circuits are often used in the packaging process.

As shown in FIG. 1, in a conventional semiconductor package 1, a plurality of semiconductor chips 11 that are spaced apart each other are disposed on a package substrate 10 having a plurality of redistribution layers (RDLs) 100 via a plurality of conductive bumps 12, wherein the conductive bumps 12 are covered with an underfill 13, and the semiconductor chips 11 and the underfill 13 are covered with an encapsulant 14.

However, in the conventional semiconductor package 1, because the plurality of semiconductor chips 11 are arranged on the package substrate 10, the package substrate 10 needs to be configured with multiple redistribution layers 100 to meet the functional signal transmission of the semiconductor chips 11. As a result, the manufacturing process of the package substrate 10 is complicated and lengthy, thus increasing the manufacturing cost of the semiconductor package 1.

Therefore, how to overcome the problems of the above-mentioned prior art has become an urgent problem to be solved at present.

SUMMARY

In view of the aforementioned shortcomings of the prior art, the present disclosure provides an electronic package, which comprises: a carrier structure having a first surface and a second surface opposing the first surface, the carrier structure including an insulating layer and a circuit layer formed on the insulating layer; a first electronic element disposed on the first surface of the carrier structure and electrically connected to the circuit layer; a second electronic element disposed on the first surface of the carrier structure and electrically connected to the circuit layer, wherein the first electronic element and the second electronic element are electrically connected to each other by a wire; and a packaging layer formed on the first surface of the carrier structure and covering the wire, the first electronic element and the second electronic element.

The present disclosure also provides a method of manufacturing an electronic package, the method comprises: providing a carrier structure having a first surface and a second surface opposing the first surface, wherein the carrier structure includes an insulating layer and a circuit layer disposed on the insulating layer; disposing a first electronic element and a second electronic element on the first surface of the carrier structure, wherein the first electronic element and the second electronic element are electrically connected to the circuit layer, wherein the first electronic element and the second electronic element are electrically connected to each other by a wire; and forming a packaging layer on the first surface of the carrier structure to cover the wire, the first electronic element and the second electronic element.

In the aforementioned electronic package and method, the wire is a gold wire.

In the aforementioned electronic package and method, the first electronic element is electrically connected to the circuit layer by wire bonding.

In the aforementioned electronic package and method, the second electronic element is electrically connected to the circuit layer by wire bonding.

In the aforementioned electronic package and method, the wire between the first electronic element and the second electronic element is connected to a jumper pad disposed on the carrier structure.

In the aforementioned electronic package and method, the present disclosure further comprises forming at least one conductive pillar on the first surface of the carrier structure, wherein the at least one conductive pillar is covered by the packaging layer and electrically connected to the circuit layer. For example, the first electronic element and/or the second electronic element and the at least one conductive pillar are electrically connected to each other by another wire and a jumper pad, and the jumper pad is disposed on the carrier structure and is electrically connected to the first electronic element and/or the second electronic element and the circuit layer via the another wire. Alternatively, the present disclosure further comprises disposing a circuit structure or a conductive element on the packaging layer, wherein the circuit structure or the conductive element is electrically connected to the at least one conductive pillar.

In the aforementioned electronic package and method, the first electronic element and/or the second electronic element are electrically connected to the circuit layer via another wire and a jumper pad, and the jumper pad is disposed on the carrier structure, such that the first electronic element and/or the second electronic element are electrically connected to the jumper pad by wire bonding, and the another wire is electrically connected to the circuit layer and the jumper pad.

In the aforementioned electronic package and method, the present disclosure further comprises disposing at least one package module on the second surface of the carrier structure.

It can be seen from the above that the electronic package of the present disclosure and the manufacturing method thereof are to form the wires by a wire bonding process to replace some layers of the circuit layer of the carrier structure. Therefore, compared with the conventional package substrate, the carrier structure of the present disclosure can meet the functional signal transmission of the first and second electronic elements without configuring too many circuit layers, so as to shorten the manufacturing steps and time of the carrier structure, thereby effectively reducing the manufacturing cost of the electronic package.

DETAILED DESCRIPTION

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "on," "upper," "first," "second," "a," "one" and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

FIG. 2A to FIG. 2F are schematic cross-sectional views illustrating a manufacturing method of an electronic package 2 according to the present disclosure.

Figure 1:
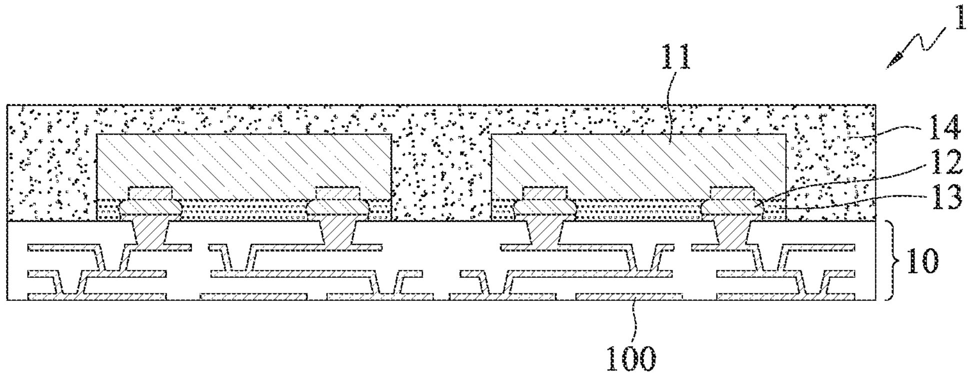
FIG. 1 is a schematic cross-sectional view of a conventional semiconductor package.
Figure 2A:
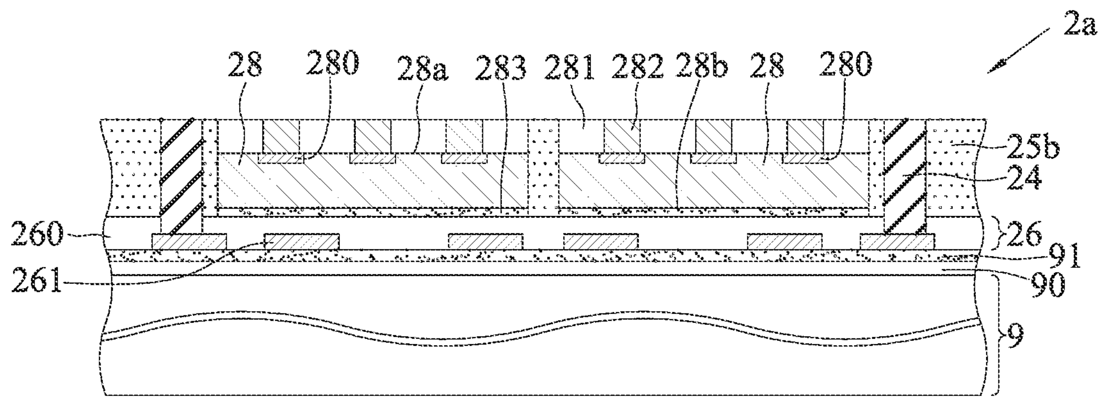
FIG. 2A to FIG. 2F are schematic cross-sectional views illustrating a manufacturing method of an electronic package according to the present disclosure.

As shown in FIG. 2A, a routing structure 26 (e.g., a wiring structure) is bonded onto a carrier board 9, then a plurality of conductive pillars 24 electrically connected to the routing structure 26 are formed on the routing structure 26, and a plurality of functional electronic elements 28 are disposed on the routing structure 26, and then the functional electronic elements 28 are covered with a cladding layer 25*b* to form a package module 2*a*.

The carrier board 9 is, for example, a circular board body made of semiconductor material, on which a release layer 90 and a bonding layer 91 are sequentially formed by coating, so that the routing structure 26 is disposed on the bonding layer 91.

The routing structure 26 has at least one dielectric layer 260 and at least one routing layer 261 disposed on the at least one dielectric layer 260.

In an embodiment, the material for forming the routing layer 261 is such as copper, and the material for forming the dielectric layer 260 is such as polybenzoxazole (PBO), polyimide (PI), prepreg (PP), or other dielectric materials.

Each of the functional electronic elements 28 is an active element, a passive element, or a combination of the active element and the passive element, wherein the active element is such as a semiconductor chip, and the passive element is such as a resistor, a capacitor, or an inductor.

In an embodiment, each of the functional electronic elements 28 is a semiconductor chip and has an active surface 28*a* and an inactive surface 28*b* opposing the active surface 28*a*, wherein each of the functional electronic elements 28 is adhered on the routing structure 26 via an adhesive 283 on the inactive surface 28*b* of the functional electronic element 28, and a plurality of electrode pads 280 are formed on the active surface 28*a* for bonding a plurality of conductors 282, and wherein a protection layer 281 such as an insulating film is formed on the active surface 28*a*, so that the electrode pads 280 and the conductors 282 are covered by the protection layer 281. For example, the conductors 282 are spherical like solder balls, or columns of metal materials such as copper pillars, solder bumps, etc., or studs made by wire-bonding machines, but are not limited thereto. It should be understood that the top surfaces of the conductors 282 can also be exposed from the protection layer 281.

The conductive pillars 24 are disposed on a part of the surface of the routing layer 261 and electrically connected to the routing layer 261.

In an embodiment, the conductive pillars 24 are metal pillars such as copper pillars formed by electroplating; alternatively, the conductive pillars 24 are solder pillars.

The cladding layer 25*b* is formed on the routing structure 26, so that the functional electronic elements 28 (including the protection layer 281 or the conductors 282 of the functional electronic elements 28) and the conductive pillars 24 are covered by the cladding layer 25*b*. Then, via a leveling process, the upper surface of the cladding layer 25*b* is flush with an upper surface of the protection layer 281, end surfaces of the conductive pillars 24 and end surfaces of the conductors 282, so that the upper surface of the protection layer 281, the end surfaces of the conductive pillars 24 and the end surfaces of the conductors 282 are exposed from the cladding layer 25*b*.

In an embodiment, the material for forming the cladding layer 25*b* is polyimide (PI), dry film, insulating material such as epoxy resin, or molding compound, but not limited to the above. For example, the cladding layer 25*b* can be formed on the routing structure 26 by lamination or molding.

Moreover, the leveling process is to remove partial material of the conductive pillar 24, partial material of the protection layer 281 (according to requirements, partial material of the conductor 282 can be removed at the same time) and partial material of the cladding layer 25*b* by grinding. It should be understood that if the conductors 282 have been exposed from the protection layer 281, then removing partial material of the protection layer 281 can make the conductors 282 exposed from the cladding layer 25*b* (according to requirements, partial material of the protection layer 281 and partial material of the conductor 282 can also be removed at the same time, so that the conductors 282 are exposed from the cladding layer 25*b*).

Figure 2B:
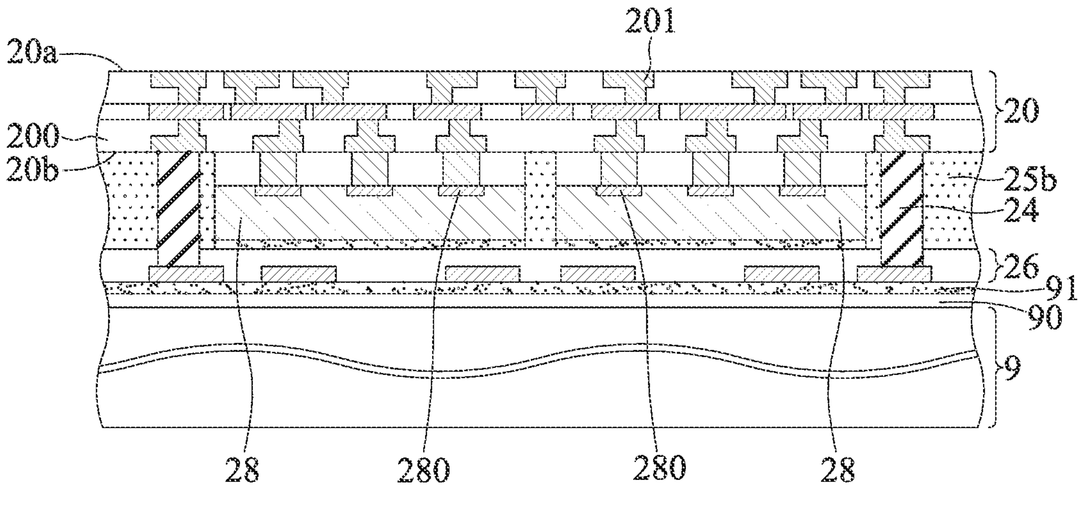

As shown in FIG. 2B, the package module 2*a* is used as a support structure to form a carrier structure 20 on the cladding layer 25*b*, and the carrier structure 20 is electrically connected to the plurality of conductive pillars 24 and the conductors 282, so that the functional electronic elements 28 are electrically connected to the carrier structure 20 via the conductors 282, wherein the carrier structure 20 has a first surface 20*a* and a second surface 20*b* opposing the first surface 20*a*, so that the carrier structure 20 is bonded to the package module 2*a* via the second surface 20*b* of the carrier structure 20.

In an embodiment, the carrier structure 20 includes at least one first insulating layer 200, and at least one first circuit layer 201, such as of a redistribution layer (RDL) form, disposed on the at least one first insulating layer 200. For example, the material for forming the first circuit layer 201 is copper, and the material for forming the first insulating layer 200 is polybenzoxazole (PBO), polyimide (PI), prepreg (PP), or other dielectric materials.

Figure 2C:
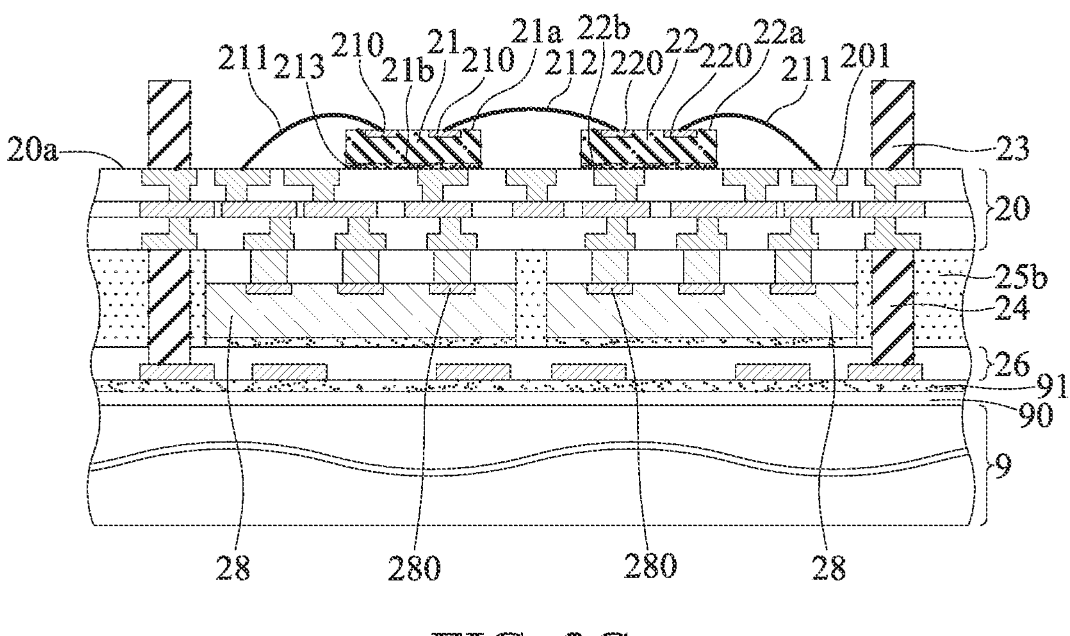

As shown in FIG. 2C, at least one first electronic element 21 and at least one second electronic element 22 are disposed on the first surface 20*a* of the carrier structure 20, and a plurality of conductive pillars 23 are formed on the carrier structure 20.

The first and second electronic elements 21, 22 are electrically connected to the first circuit layer 201 of the carrier structure 20 via a plurality of wires 211 such as gold wires or other bonding wires in a wire-bonding manner.

In an embodiment, the first and second electronic elements 21, 22 are semiconductor chips and have active surfaces 21*a*, 22*a* and inactive surfaces 21*b*, 22*b* opposing the active surfaces 21*a*, 22*a*, wherein the first and second electronic elements 21, 22 are adhered on the carrier structure 20 with the inactive surfaces 21*b*, 22*b* of the first and second electronic elements 21, 22 via an adhesive layer 213 such as glue, and a plurality of electrode pads 210, 220 are formed on the active surfaces 21*a*, 22*a*, so that the wires 211 are connected to the electrode pads 210, 220 and the first circuit layer 201.

Moreover, some electrode pads 210, 220 of the first and second electronic elements 21, 22 are also electrically connected to each other via a wire 212, so that the first and second electronic elements 21, 22 achieve the purpose of electrical bridging.

Figure 2D:
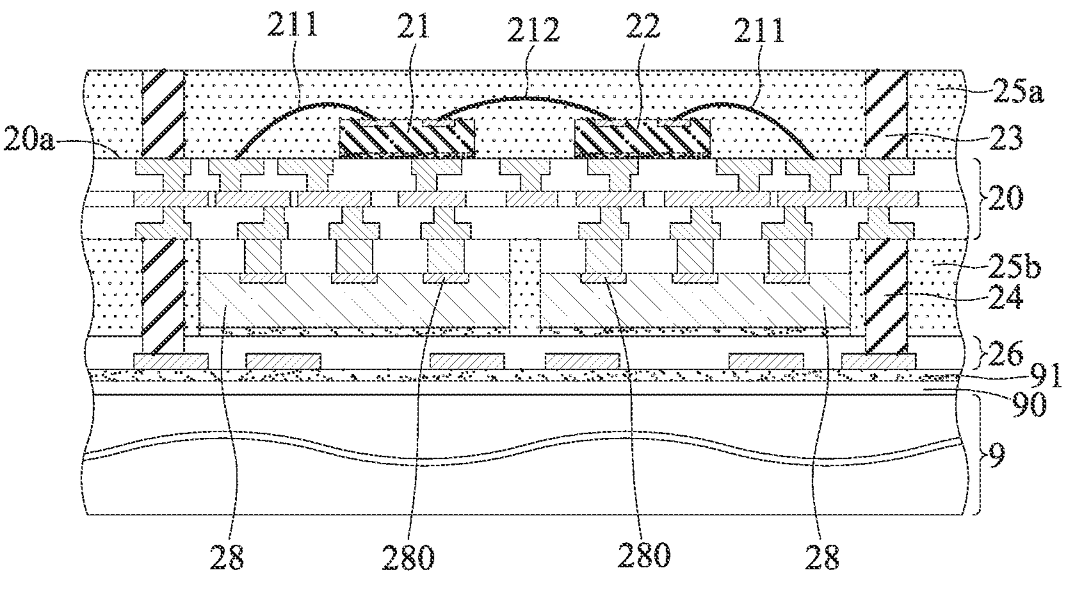

As shown in FIG. 2D, a packaging layer 25*a* is formed on the first surface 20*a* of the carrier structure 20, so that the first and second electronic elements 21, 22, the wires 211, 212 and the conductive pillars 23 are covered by the packaging layer 25*a*.

In an embodiment, the material for forming the packaging layer 25*a* is polyimide (PI), dry film, insulating material such as epoxy resin, or molding compound, but not limited to the above. For example, the packaging layer 25*a* can be formed on the first surface 20*a* of the carrier structure 20 by lamination or molding. It should be understood that the material of the packaging layer 25*a* and the material of the cladding layer 25*b* may be the same or different.

Furthermore, via the leveling process, an upper surface of the packaging layer 25*a* is flush with end surfaces of the conductive pillars 23, so that the end surfaces of the conductive pillars 23 are exposed from the packaging layer 25*a*. For example, the leveling process is to remove partial material of the conductive pillars 23 and partial material of the packaging layer 25*a* by grinding.

Figure 2E:
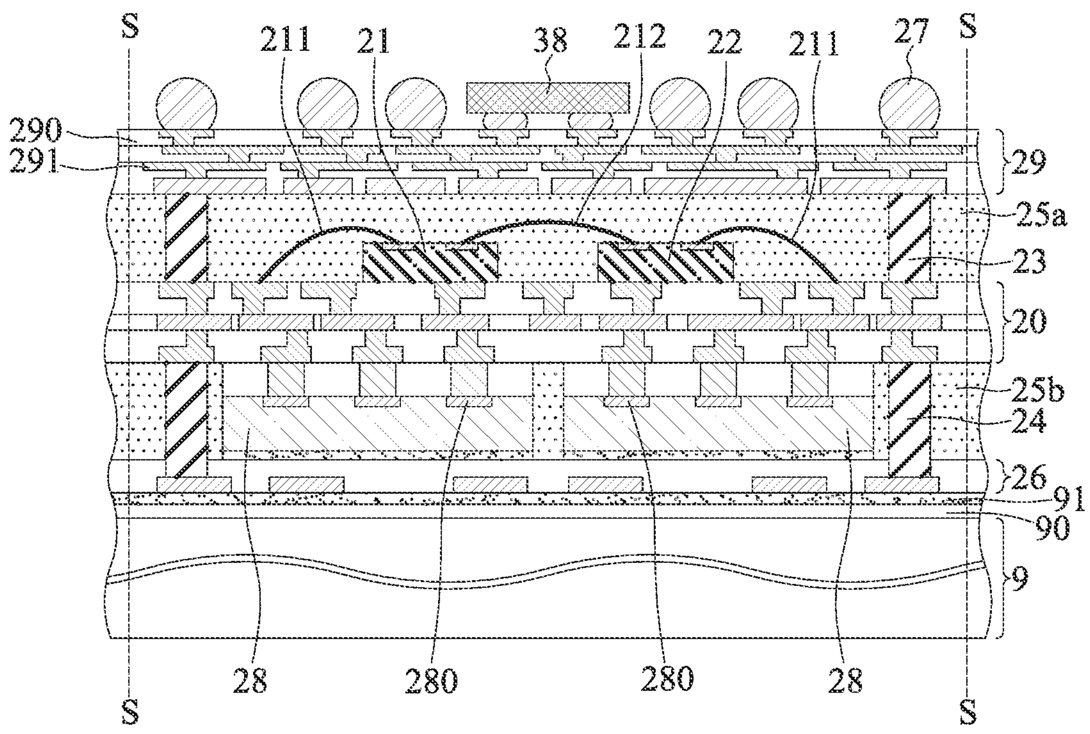

As shown in FIG. 2E, a circuit structure 29 is formed on the packaging layer 25*a*, so that the circuit structure 29 is electrically connected to the conductive pillars 23.

In an embodiment, the circuit structure 29 includes at least one second insulating layer 290 and at least one second circuit layer 291 (such as of RDL form) disposed on the at least one second insulating layer 290, and the outermost second insulating layer 290 can be used as a solder-resist layer, so that the outermost second circuit layer 291 is exposed from the solder-resist layer.

Moreover, the material for forming the second circuit layer 291 is copper, and the material for forming the second insulating layer 290 is polybenzoxazole (PBO), polyimide (PI), prepreg (PP), or other dielectric materials.

Furthermore, a plurality of conductive elements 27 such as solder balls are formed on the outermost second circuit layer 291. For example, an under bump metallurgy (UBM) layer can be formed on the outermost second circuit layer 291 to facilitate the bonding of the conductive elements 27.

In addition, at least one auxiliary electronic element 38 can be disposed on the outermost second circuit layer 291 according to requirements, and the auxiliary electronic element 38 is electrically connected to the second circuit layer 291 via a conductive material such as solder material. For example, the auxiliary electronic element 38 is an active element, a passive element, or a combination of the active element and the passive element, wherein the active element is such as a semiconductor chip, and the passive element is such as a resistor, a capacitor, or an inductor.

Figure 2F:
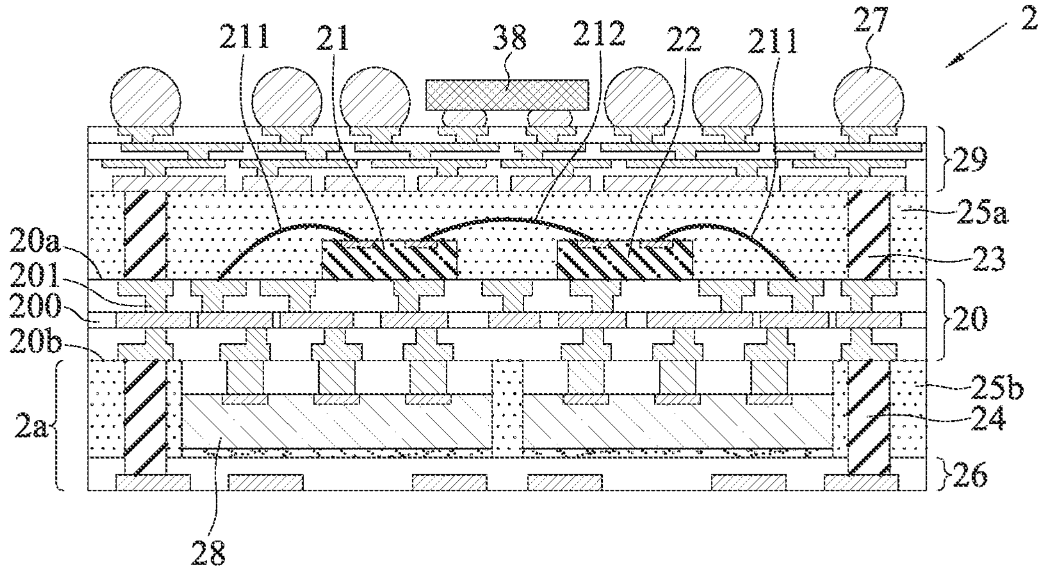

As shown in FIG. 2F, a singulation process is performed along cutting paths S shown in FIG. 2E, and the carrier board 9 and the release layer 90 and the bonding layer 91 on the carrier board 9 are removed to expose the routing structure 26, so as to form the electronic package 2.

Figure 2G:
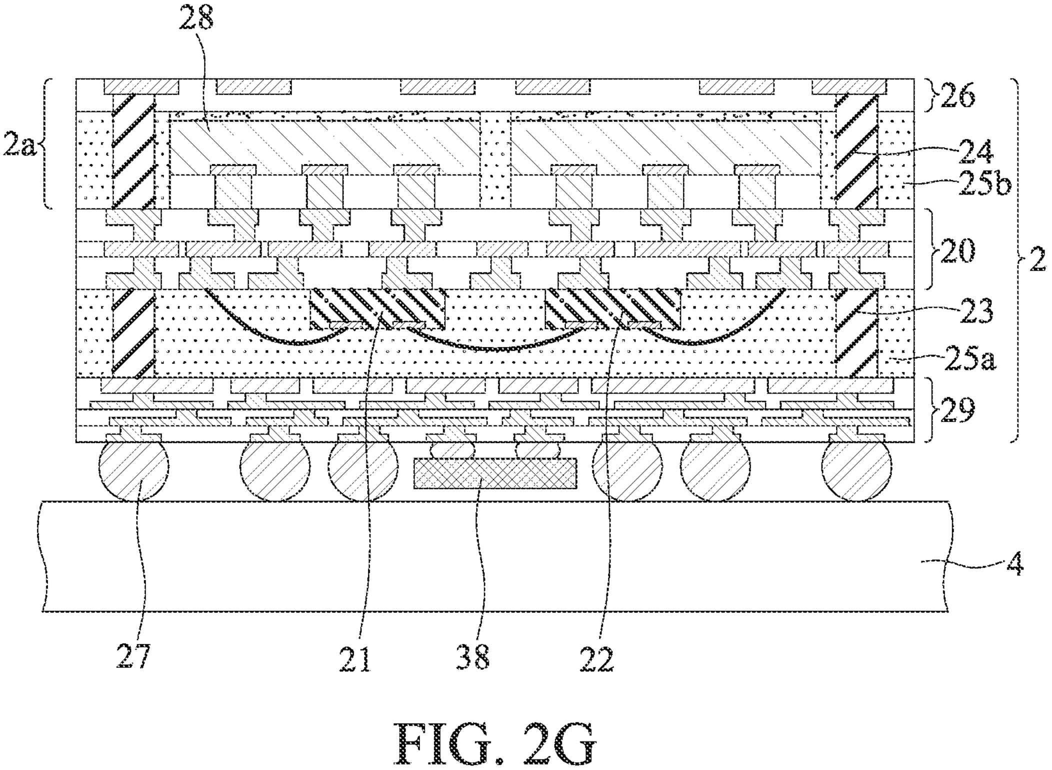
FIG. 2G is a schematic cross-sectional view showing a subsequent process of FIG. 2F.

In an embodiment, the electronic package 2 can be disposed on an electronic device 4 such as a circuit board via the plurality of conductive elements 27 in a subsequent manufacturing process, as shown in FIG. 2G.

Figure 3A:
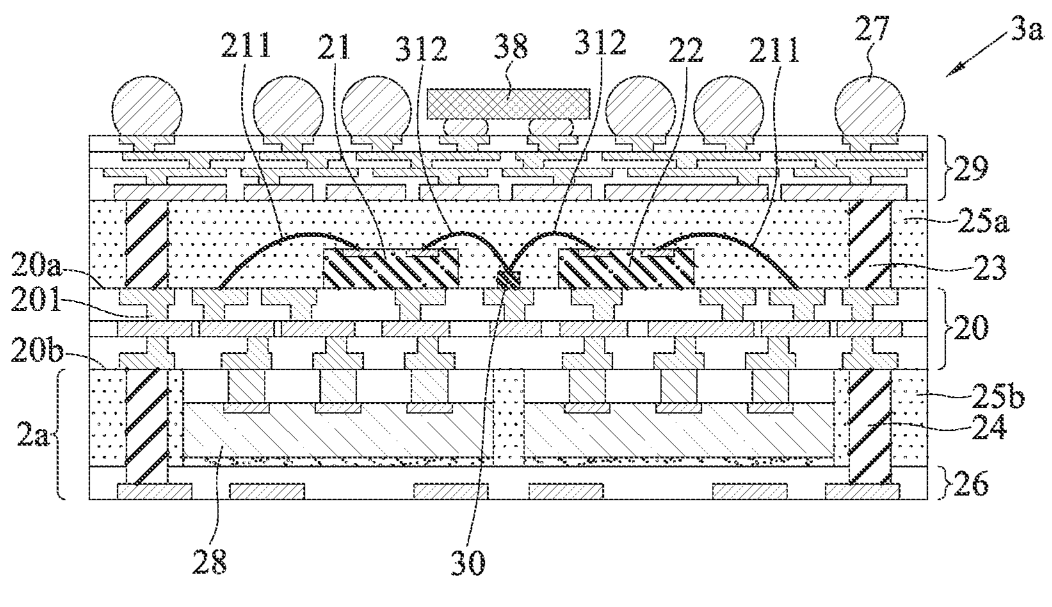
FIG. 3A to FIG. 3C are schematic cross-sectional views showing other different embodiments of FIG. 2F.

Furthermore, in other embodiments, as shown in FIG. 3A of an electronic package 3*a*, in the manufacturing process shown in FIG. 2C, at least one jumper pad 30 can be formed on the carrier structure 20 (the outermost first circuit layer 201 or the first insulating layer 200), so that some electrode pads 210, 220 of the first and second electronic elements 21, 22 are connected to the jumper pad 30 via wires 312, so as to electrically conduct the first and second electronic elements 21, 22 with each other. Therefore, the first and second electronic elements 21, 22 can achieve the purpose of electrical bridging.

Figure 3B:
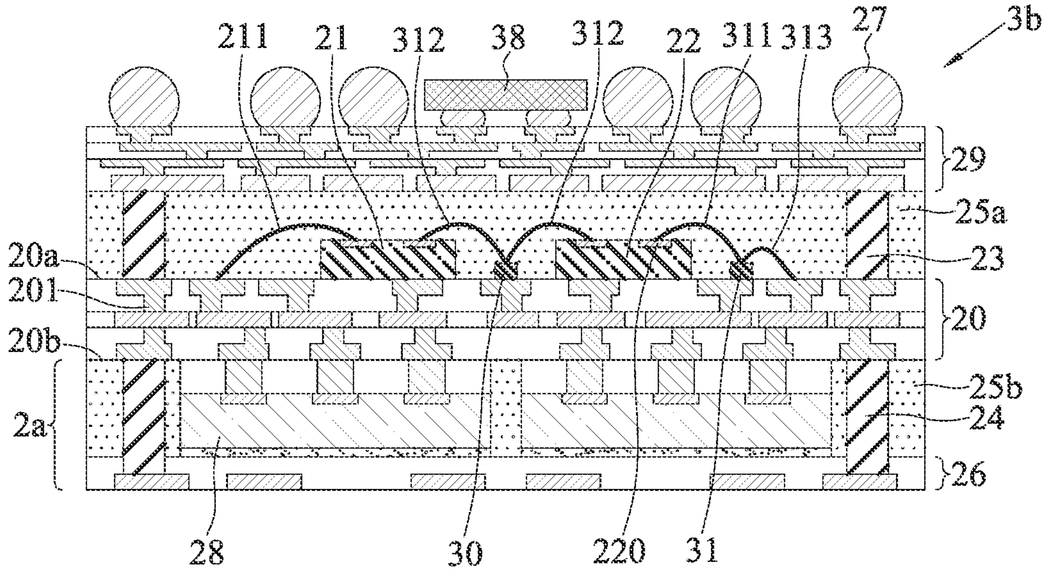

Alternatively, as shown in FIG. 3B of an electronic package 3*b*, some electrode pads 220 of the second electronic element 22 can also be connected to another jumper pad 31 by a wire 311, and the jumper pad 31 is disposed on the first circuit layer 201, so that the jumper pad 31 is connected to the outermost first circuit layer 201 of the carrier structure 20 via another wire 313, such that the second electronic element 22 can be electrically connected to the first circuit layer 201 via the wires 311, 313 and the jumper pad 31. It should be understood that the second electronic element 22 and the conductive pillars 23 can also be electrically connected to each other via the wires 311, 313 and the jumper pad 31.

Similarly, the first electronic element 21 can also be electrically connected to the carrier structure 20 or the conductive pillars 23 via wires and jumper pads.

Therefore, the manufacturing method of the electronic package 2 of the present disclosure is to form the wires 211, 212, 311, 312, 313 by a wire-bonding process to replace some layers of the first circuit layer 201 (RDL) of the carrier structure 20. Therefore, compared with the conventional package substrate, the carrier structure 20 of the present disclosure can satisfy the functional signal transmission of the first and second electronic elements 21, 22 without configuring too many first circuit layers 201, so as to shorten the manufacturing steps and time of the carrier structure 20, thereby effectively reducing the manufacturing cost of the electronic package 2.

Figure 3C:
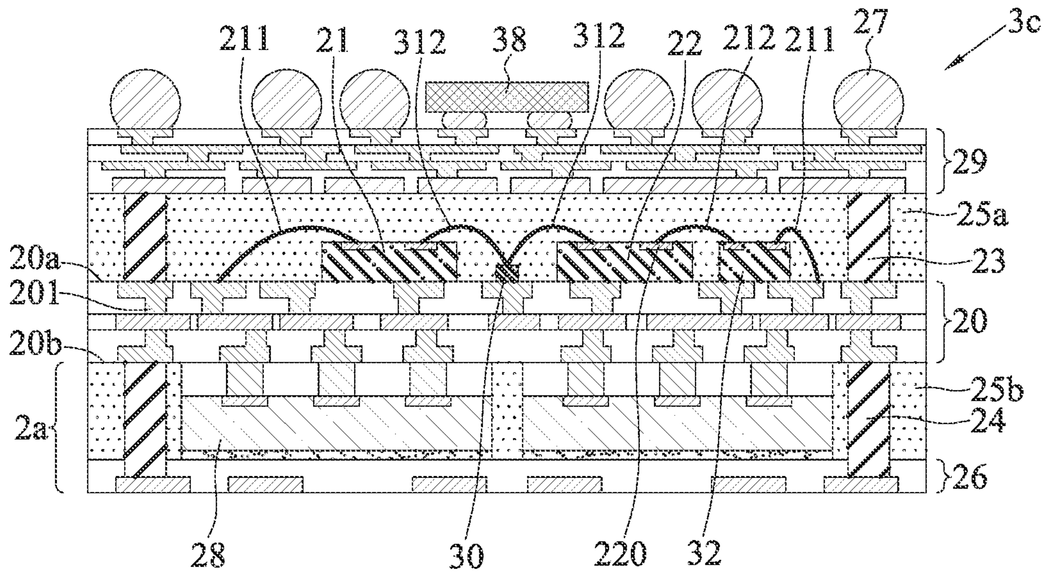

Further, the number of the second electronic elements 22 can be designed according to requirements, as shown in FIG. 3C, an electronic package 3*c* includes a plurality of second electronic elements 22, 32, and the present disclosure is not limited to as such.

The present disclosure also provides an electronic package 2, 3*a*, 3*b*, which includes: a carrier structure 20, a first electronic element 21, a second electronic element 22, and a packaging layer 25*a*.

The carrier structure 20 has a first surface 20*a* and a second surface 20*b* opposing the first surface 20*a*, and the carrier structure 20 includes a first insulating layer 200 and a first circuit layer 201 disposed on the first insulating layer 200.

The first electronic element 21 is disposed on the first surface 20*a* of the carrier structure 20 and electrically connected to the first circuit layer 201.

The second electronic element 22 is disposed on the first surface 20*a* of the carrier structure 20 and electrically connected to the first circuit layer 201, wherein the first and second electronic elements 21, 22 are electrically connected to each other by a wire 212, 312.

The packaging layer 25*a* is disposed on the first surface 20*a* of the carrier structure 20 to cover the wire 212, the first and second electronic elements 21, 22.

In one embodiment, the wire 212, 312 is a gold wire.

In one embodiment, the first electronic element 21 is electrically connected to the first circuit layer 201 by wire bonding.

In one embodiment, the second electronic element 22 is electrically connected to the first circuit layer 201 by wire bonding.

In one embodiment, the wire 312 between the first and second electronic elements 21, 22 is connected to a jumper pad 30 disposed on the carrier structure 20.

In one embodiment, at least one conductive pillar 23 is formed on the first surface 20*a* of the carrier structure 20 and covered by the packaging layer 25*a*, wherein the at least one conductive pillar 23 is electrically connected to the first circuit layer 201. For example, the first and/or second electronic elements 21, 22 and the conductive pillar 23 are electrically connected to each other by other wires 311, 313 and a jumper pad 31, and the jumper pad 31 is disposed on the carrier structure 20 and electrically connected to the first and/or second electronic elements 21, 22 and the first circuit layer 201 by the other wires 311, 313. Alternatively, a circuit structure 29 or a conductive element 27 electrically connected to the conductive pillar 23 is disposed on the packaging layer 25*a*.

In one embodiment, the first and/or second electronic elements 21, 22 are electrically connected to the first circuit layer 201 by the other wire 313 and the jumper pad 31, and the jumper pad 31 is disposed on the carrier structure 20, so that the first and/or second electronic elements 21, 22 are electrically connected to the jumper pad 31 by wire bonding, and the other wire 313 is electrically connected to the first circuit layer 201 and the jumper pad 31.

In one embodiment, at least one package module 2*a* is disposed on the second surface 20*b* of the carrier structure 20.

To sum up, the electronic package of the present disclosure and manufacturing method thereof are to form the wires by a wire-bonding process to replace the number of layers of some circuit layers of the carrier structure. Therefore, the carrier structure of the present disclosure can satisfy the functional signal transmission of the first and second electronic elements without configuring too many circuit layers, so as to shorten the manufacturing process steps and time of the carrier structure, thereby effectively reducing the manufacturing cost of the electronic package.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. An electronic package, comprising:

a carrier structure having a first surface and a second surface opposing the first surface, the carrier structure including an insulating layer and a circuit layer formed on the insulating layer;

at least one conductive pillar formed on the first surface of the carrier structure, wherein the at least one conductive pillar is electrically connected to the circuit layer;

a first electronic element disposed on the first surface of the carrier structure and electrically connected to the circuit layer;

a second electronic element disposed on the first surface of the carrier structure and electrically connected to the circuit layer, wherein the first electronic element and the second electronic element are electrically connected to each other by a wire; and a packaging layer formed on the first surface of the carrier structure and covering the wire, the first electronic element, the second electronic element and the at least one conductive pillar, wherein the first electronic element and/or the second electronic element and the at least one conductive pillar are electrically connected to each other by another wire and a jumper pad, and the jumper pad is disposed on the carrier structure and is electrically connected to the first electronic element and/or the second electronic element and the circuit layer via the another wire.

2. The electronic package of claim 1, wherein the wire is a gold wire.

3. The electronic package of claim 1, wherein the first electronic element is electrically connected to the circuit layer by wire bonding.

4. The electronic package of claim 1, wherein the second electronic element is electrically connected to the circuit layer by wire bonding.

5. The electronic package of claim 1, wherein the wire between the first electronic element and the second electronic element is connected to a jumper pad disposed on the carrier structure.

6. The electronic package of claim 1, further comprising a circuit structure or a conductive element disposed on the packaging layer and electrically connected to the at least one conductive pillar.

7. An electronic package, comprising:

a carrier structure having a first surface and a second surface opposing the first surface, the carrier structure including an insulating layer and a circuit layer formed on the insulating layer;

a first electronic element disposed on the first surface of the carrier structure and electrically connected to the circuit layer;

a second electronic element disposed on the first surface of the carrier structure and electrically connected to the circuit layer, wherein the first electronic element and the second electronic element are electrically connected to each other by a wire; and a packaging layer formed on the first surface of the carrier structure and covering the wire, the first electronic element and the second electronic element, wherein the first electronic element and/or the second electronic element are electrically connected to the circuit layer via another wire and a jumper pad, and the jumper pad is disposed on the carrier structure, such that the first electronic element and/or the second electronic element are electrically connected to the jumper pad by wire bonding, and the another wire is electrically connected to the circuit layer and the jumper pad.

8. The electronic package of claim 1, further comprising at least one package module disposed on the second surface of the carrier structure.

9. A method of manufacturing an electronic package, comprising:

providing a carrier structure having a first surface and a second surface opposing the first surface, wherein the carrier structure includes an insulating layer and a circuit layer disposed on the insulating layer;

forming at least one conductive pillar on the first surface of the carrier structure, wherein the at least one conductive pillar is electrically connected to the circuit layer;

disposing a first electronic element and a second electronic element on the first surface of the carrier structure, wherein the first electronic element and the second electronic element are electrically connected to the circuit layer, and the first electronic element and the second electronic element are electrically connected to each other by a wire; and forming a packaging layer on the first surface of the carrier structure to cover the wire, the first electronic element, the second electronic element and the at least one conductive pillar, wherein the first electronic element and/or the second electronic element and the at least one conductive pillar are electrically connected to each other by another wire and a jumper pad, and the jumper pad is disposed on the carrier structure and is electrically connected to the first electronic element and/or the second electronic element and the circuit layer via the another wire.

10. The method of claim 9, wherein the wire is a gold wire.

11. The method of claim 9, wherein the first electronic element is electrically connected to the circuit layer by wire bonding.

12. The method of claim 9, wherein the second electronic element is electrically connected to the circuit layer by wire bonding.

13. The method of claim 9, wherein the wire between the first electronic element and the second electronic element is connected to a jumper pad disposed on the carrier structure.

14. The method of claim 9, further comprising disposing a circuit structure or a conductive element on the packaging layer, wherein the circuit structure or the conductive element is electrically connected to the at least one conductive pillar.

15. A method of manufacturing an electronic package, comprising:

providing a carrier structure having a first surface and a second surface opposing the first surface, wherein the carrier structure includes an insulating layer and a circuit layer disposed on the insulating layer;

disposing a first electronic element and a second electronic element on the first surface of the carrier structure, wherein the first electronic element and the second electronic element are electrically connected to the circuit layer, and the first electronic element and the second electronic element are electrically connected to each other by a wire; and forming a packaging layer on the first surface of the carrier structure to cover the wire, the first electronic element and the second electronic element, wherein the first electronic element and/or the second electronic element are electrically connected to the circuit layer via another wire and a jumper pad, and the jumper pad is disposed on the carrier structure, such that the first electronic element and/or the second electronic element are electrically connected to the jumper pad by wire bonding, and the another wire is electrically connected to the circuit layer and the jumper pad.

16. The method of claim 9, further comprising disposing at least one package module on the second surface of the carrier structure.

* * * * *